United States Patent
Leonardi et al.

(10) Patent No.: US 8,575,720 B2
(45) Date of Patent: Nov. 5, 2013

(54) PROCESS FOR INTEGRATING ON AN INERT SUBSTRATE A DEVICE COMPRISING AT LEAST A PASSIVE ELEMENT AND AN ACTIVE ELEMENT AND CORRESPONDING INTEGRATED DEVICE

(75) Inventors: Salvatore Leonardi, Aci S. Antonio (IT); Salvatore Coffa, Tremestieri Etneo (IT); Claudia Caligiore, Giarre (IT); Francesca Paola Tramontana, Enna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1495 days.

(21) Appl. No.: 11/803,716

(22) Filed: May 14, 2007

(65) Prior Publication Data
US 2008/0029816 A1    Feb. 7, 2008

(30) Foreign Application Priority Data
May 15, 2006  (EP) .................................. 06425328

(51) Int. Cl.
*H01L 27/08* (2006.01)
(52) U.S. Cl.
USPC ............... 257/531; 257/69; 257/72; 257/411; 257/528; 257/532; 257/538; 257/E21.269; 257/E21.293; 257/E21.413; 257/E27.111; 257/E27.113; 257/E29.151; 438/30; 438/69; 438/149; 438/190; 438/210; 345/92; 345/55
(58) Field of Classification Search
USPC ...................... 257/69, 72, 411, 528, 531, 532, 257/E21.269, E21.293, E21.413, E27.111, 257/E27.113, E29.151, 7, 154, 277, 350, 257/379, 499, 516, 533, 536–538, 595, 724, 257/E51.005; 438/30, 69, 149, 190, 210, 438/FOR. 184, FOR. 209, FOR. 211, 438/FOR. 201, 171, 238, 239, 329, 381, 438/382, FOR. 207; 349/FOR. 124; 345/92, 345/55; 379/390.04, 391, 402
See application file for complete search history.

(56) References Cited

U.S. PATENT DOCUMENTS

| | | | |
|---|---|---|---|
| 6,218,678 B1 | 4/2001 | Zhang et al. | 257/59 |
| 6,607,947 B1 | 8/2003 | Zhang et al. | 438/149 |
| 6,964,890 B1 | 11/2005 | Yamazaki et al. | 438/166 |
| 2002/0027247 A1 | 3/2002 | Arao et al. | 257/347 |
| 2002/0167068 A1 | 11/2002 | Hsu et al. | 257/507 |

(Continued)

OTHER PUBLICATIONS

Cuscunà, M., et al., "A Novel Fabrication Process for Polysilicon Thin Film Transistors with Source/Drain Contacts Formed by Deposition and Lift-Off of Highly Doped Layers," Solid-State Electronics, vol. 46, Feb. 14, 2002, pp. 1351-1358.

*Primary Examiner* — Meiya Li
(74) *Attorney, Agent, or Firm* — Seed IP Law Group PLLC

(57) ABSTRACT

A process is described for integrating, on an inert substrate, a device having at least one passive component and one active component. The process comprises: deposition of a protection dielectric layer on the inert substrate; formation of a polysilicon island on the protection dielectric layer; integration of the active component on the polysilicon island; deposition of the covering dielectric layer on the protection dielectric layer and on the active component; integration of the passive component on the covering dielectric layer; formation of first contact structures in openings realised in the covering dielectric layer in correspondence with active regions of the active component; and formation of second contact structures in correspondence with the passive component. An integrated device obtained through this process is also described.

38 Claims, 7 Drawing Sheets

(56) References Cited

U.S. PATENT DOCUMENTS

| | | | |
|---|---|---|---|
| 2003/0089991 A1 | 5/2003 | Yamazaki et al. | 257/759 |
| 2005/0127443 A1 | 6/2005 | Ishikawa | 257/347 |
| 2005/0190312 A1 | 9/2005 | Yang | 349/38 |
| 2006/0055319 A1* | 3/2006 | Uemura et al. | 313/504 |
| 2007/0164293 A1* | 7/2007 | Hamano et al. | 257/79 |

* cited by examiner

PROCESS FOR INTEGRATING ON AN INERT SUBSTRATE A DEVICE COMPRISING AT LEAST A PASSIVE ELEMENT AND AN ACTIVE ELEMENT AND CORRESPONDING INTEGRATED DEVICE

BACKGROUND

1. Technical Field

The present disclosure relates to a process for integrating, on an inert substrate, a device.

2. Description of the Related Art

The integration technology of passive components, indicated as IPD (acronym of the English: "Integrated Passive Devices") technology is used in several sectors of the microelectronics, in particular in the so-called base band fields and in radio-frequency (RF).

Thin film IPD technology integrates different passive semiconductor components, such as resistors (R), inductors (L) and capacitors (C), together with transmission lines (for example coplanar wave guide lines) and interconnections (such as between different metals). These components are integrated on an inert substrate, such as for example glass or other materials being compatible with an integration process of resistors-inductors-capacitors, or RLC process.

IPD technology uses a different layer or thin active layer for the integration of each one of the passive elements.

BRIEF SUMMARY

An embodiment introduces, in an integration flow according to the IPD technology, a process sequence able to realise an active device on a same substrate used for the integration of passive components in this technology, i.e., in a compatible way with the materials used in this technology, in particular for realising this substrate.

Some of the characteristics and the advantages of an embodiment of the integration process and of the integrated device will be apparent from the following description of an embodiment thereof given by way of indicative and non limiting example with reference to the annexed drawings.

In one embodiment, a process for integrating, on an inert substrate a device having at least one passive component and one active component, comprises the steps of: deposition of a protection dielectric layer on said inert substrate; formation of a polysilicon island on said protection dielectric layer; integration of said active component on said polysilicon island; deposition of a covering dielectric layer on said protection dielectric layer and on said active component; integration of said passive component on said covering dielectric layer; formation of first contact structures in openings realised in said covering dielectric layer in correspondence with active regions of said active component; and formation of second contact structures in correspondence with said passive component.

In one embodiment a process for integrating, on an inert substrate, a device having at least one passive component and one active component, comprises the steps of: deposition of a protection dielectric layer on the inert substrate; deposition of an amorphous silicon layer on the protection dielectric layer; crystallisation of the amorphous silicon layer to form a polysilicon film; photolithographic definition and etching of the polysilicon film to form a polysilicon island on the protection dielectric layer; integration of the active component on the polysilicon island; deposition of a covering dielectric layer on the protection dielectric layer and on the active component; integration of the passive component on the covering dielectric layer; formation of first contact structures in the covering dielectric layer for active regions of the active component; and formation of second contact structures for the passive component. In one embodiment, the deposition step of a protection dielectric layer on said inert substrate is carried out at a temperature lower than a threshold temperature, in particular a melting one, of said inert substrate. In one embodiment, the deposition step of said amorphous silicon layer on said protection dielectric layer is carried out at a temperature lower than a threshold temperature, in particular a melting one, of said inert substrate through a PECVD [Plasma-Enhanced Chemical Vapor Deposition] process. In one embodiment, the crystallisation step of said amorphous silicon layer is realised through radiance by a laser with excimers and a PLC [Pulsed Laser Crystallization] technique for an ultra quick melting and successive resolidification of grains of said amorphous silicon layer. In one embodiment, the integration step of said active component on said polysilicon island comprises an integration step of a thin film transistor [TFT]. In one embodiment, the integration step of a TFT transistor comprises the steps of: deposition of a dielectric layer suitable to form a gate dielectric layer of said TFT transistor; and deposition, on said gate dielectric layer, of a first conductive layer suitable to form a gate metallization layer of said TFT transistor, said deposition steps being carried out with temperature lower than a threshold temperature, in particular a melting one, of said inert substrate. In one embodiment, the integration step of said TFT transistor further comprises a photolithographic definition and etching step of said first conductive layer and, subsequently, of said gate dielectric layer to define a gate region of said TFT transistor. In one embodiment, the photolithographic definition and etching step is carried out in dry to realise a precise dimensional control of said gate region. In one embodiment, the integration step of said TFT transistor further comprises dopant implantation steps for the formation of doped regions in said polysilicon island in correspondence with active regions, in particular source and drain ones as well as of a channel region of said TFT transistor. In one embodiment, the dopant implantation steps are realised after said deposition step of said covering dielectric layer which acts as a spacer around said gate region, said doped regions thus resulting self-aligned with said gate region. In one embodiment, the dopant implantation steps are realised with dopant doses in the order of $10^{14} \div 10^{15}$ atoms/cm$^2$ and energy from 10 to 100 keV. In one embodiment, the process further comprises an annealing step for the activation of said dopants carried out through laser. In one embodiment, the process further comprising, prior to the crystallisation step of the amorphous silicon layer, dopant implantation steps for the formation, through an implant mask, of doped regions in the polysilicon layer to form active source and drain regions, as well as a channel region of a thin film transistor (TFT). Integration process according to claim 13 further comprising, simultaneously with the crystallisation step of the amorphous silicon layer, activating the doped regions using a laser. In one embodiment, the integration step of said active component on said polysilicon island comprises an integration step of the thin film transistor [TFT]. In one embodiment, the integration step of the TFT transistor comprises the steps of: deposition of a dielectric layer suitable to form a gate dielectric layer of said TFT transistor; and deposition, on said gate dielectric layer, of a first conductive layer, said deposition steps being carried out at a temperature lower than a threshold temperature, in particular a melting one, of said inert substrate in one embodiment, the integration step of said TFT transistor further comprises a photolithographic definition and etching step of said first conductive layer and, subsequently, of said gate dielectric layer to define a gate region of said TFT transistor, with formation of a non self-aligned TFT transistor. In one embodiment, the photolithographic definition and etching step is carried out in dry for realising a precise dimensional control of said gate region. In one embodiment, the Integration process further comprises, prior to said crystallisation step of said amorphous silicon layer, forming active source and drain regions as well as a channel region of a thin film transistor (TFT) using a lift-off process to produce source and drain regions surrounded by dielectric regions, not in direct contact. In one embodiment, the formation step of active regions comprises a formation step of an intermediate region between said dielectric regions and said source and drain regions. In one embodiment, the deposition step of the covering dielectric layer on the protection dielectric layer and on the active component comprises the steps of: deposition of a pre-implant dielectric layer; deposition of a further dielectric layer; definition of first openings in said pre-implant dielectric layer and in said further dielectric layer in correspondence with active regions of said active component sputtering of metallic alloys for realising electric contacts in correspondence with said first openings; and deposition of a covering dielectric layer, said pre-implant dielectric layer, further dielectric layer and covering dielectric layer forming said covering dielectric layer. In one embodiment, the Integration process further comprises the steps of: patterning for the removal of said covering dielectric layer in correspondence with said electric contacts; deposition of a conductive layer; further patterning of said conductive layer with formation of contact regions in correspondence with said electric contacts, said electric contacts and said contact regions realising said first contact structures. In one embodiment, the deposition step of said conductive layer is carried out at a temperature lower than a threshold temperature, in particular a melting one, of said inert substrate. In one embodiment, the step of definition of first openings comprises a photolithographic definition and etching in dry step to define openings in correspondence with said conduction regions, as well as an etching step in wet to define a further opening in correspondence with said control region of said active component. In one embodiment, the sputtering step of metallic alloys uses aluminium-silicon-copper alloys. In one embodiment, the further patterning step of said conductor layer comprises a photolithographic and etching in dry step. In one embodiment, the integration step of said passive component on said covering dielectric layer, said passive component being a capacitor, comprises the steps of: deposition of a first conductive layer; first patterning of said first conductive layer for the formation of at least one conductive portion suitable to realise a lower plate of said capacitor; deposition of a thin nitride layer; second patterning of said thin nitride layer for realising a nitride portion above said at least one conductive portion; deposition of a separation dielectric layer to cover at least said nitride portion and of said at least one conductive portion; deposition of a second conductive layer; and third patterning of said second conductive layer for the formation of a second conductive portion suitable to realise an upper plate of said capacitor, said deposition steps being carried out at a temperature lower than a threshold temperature, in particular a melting one, of said inert substrate. In one embodiment, the first and third patterning steps comprise photolithographic definition and etching in dry steps. In one embodiment, the integration step of said passive component on said covering dielectric layer, said passive component being a resistor, comprises the steps of: deposition of a thin nitride layer; and patterning of said thin nitride layer for the formation of at least one conductive portion suitable to realise a body of said resistor; said deposition step being carried out at a temperature lower than a threshold temperature, in particular a melting one, of said inert substrate. In one embodiment, the process includes integration of a further capacitor and in that it comprises, after said deposition step of said second conductive layer, the steps of: deposition of a second thin nitride layer; electrolysis with formation of an oxynitride layer on said second thin nitride layer; deposition of a third nitride layer; and patterning of said second thin nitride layer, of said oxynitride layer and of said third nitride layer for the definition of an island which realises said further capacitor with plates in nitride. In one embodiment, the inert substrate is of glass. In one embodiment, the inert substrate is of plastic material, said threshold temperature being a damage temperature of said plastic material. In one embodiment, the process further comprises a deposition step of an opacification layer at the back of said inert substrate.

In one embodiment, an integrated device comprises: a inert substrate; a protective dielectric layer on the inert substrate; an active component having a polysilicon island above the protection dielectric layer; a covering dielectric layer covering the protection dielectric layer and the active component; a passive component integrated above the covering dielectric layer; a plurality of electric contacts of a first conductive material in contact with corresponding active region of the active component; and a plurality of contact regions in contact with respective electric contacts in the plurality of electric contacts and of a second conductive material different from the first conductive material. In one embodiment, the active component is a thin film transistor (TFT). In one embodiment, the polysilicon island comprises doped regions corresponding to active source and drain regions of said TFT transistor, which also comprises a gate region, above said polysilicon island in a region devoid of said source and drain regions. In one embodiment, the covering dielectric layer comprises an undoped silicate glass (USG) layer. In one embodiment, the protection dielectric layer comprises an undoped silicate glass (USG) layer and acts as mechanical, electrical and thermal insulation with respect to said inert substrate. In one embodiment, the covering dielectric layer comprises a pre-implant dielectric layer, a further dielectric layer and a covering dielectric layer whereon said at least one passive component is realised. In one embodiment, the first conductive material comprises a metallic alloy. In one embodiment, the second conductive material comprises an aluminium-silicon-copper alloy. In one embodiment, the second conductive material is metallic. In one embodiment, the second conductive material is aluminium. In one embodiment, the pre-implant dielectric layer and said further dielectric layer are realised in TEOS and said covering dielectric layer is an undoped silicate glass or USG layer. In one embodiment, the protection dielectric layer has a greater thickness than said covering dielectric layer. In one embodiment, the inert substrate comprises a plastic. In one embodiment, the device further comprises an opaque layer configured to support the inert substrate.

In one embodiment, a system comprises: an inert substrate; a protective dielectric layer on the inert substrate; an active component having a polysilicon island on the protection dielectric layer; a covering dielectric layer covering the protection dielectric layer and the active component; a passive component integrated on the covering dielectric layer; an active contact structure configured to contact an active region of the active component and having a first portion of a first conductive material and a second portion of a second conductive material different from the first conductive material; and a passive contact structure configured to contact the passive component. In one embodiment, the inert substrate is opaque. In one embodiment, the passive component has a conductive element of the second conductive material.

DETAILED DESCRIPTION

Figure 1A:
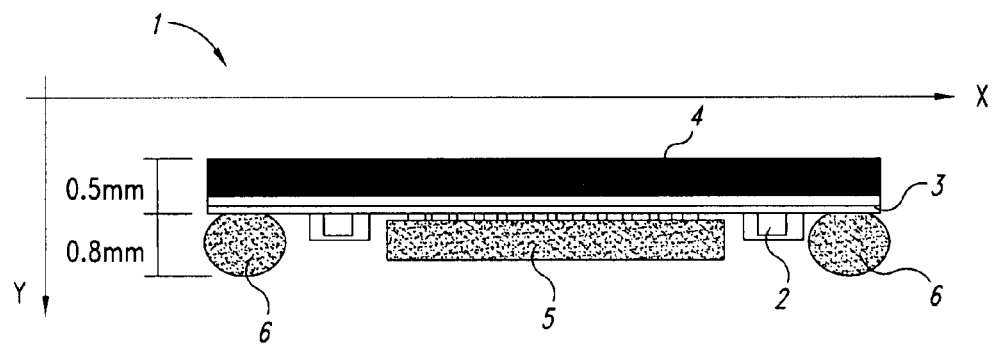
FIGS. 1A and 1B schematically show a device comprising a passive component realised with IPD technology according to the prior art.

An embodiment of a device comprising a passive component (R, L or C) realised with IPD technology in a thin layer is schematically illustrated in FIG. 1A, globally indicated with 1.

In particular, the device 1 comprises at least one passive component 2 realised in a thin layer 3 above an inert substrate 4, as well as an integrated circuit 5 associated with this inert substrate 4. The device 1 also comprises suitable contact elements or solder balls 6 realised above the thin layer 3 and having space occupations in a transversal dimension Y approximately double with respect to the thickness of the inert substrate 4 according to this same dimension Y.

In particular, in the example of FIG. 1A it has been indicated how, for an inert substrate 4 of thickness 0.5 mm, soldier balls 6 are realised having a space occupation in the transversal dimension Y equal to 0.8 mm.

Figure 1B:
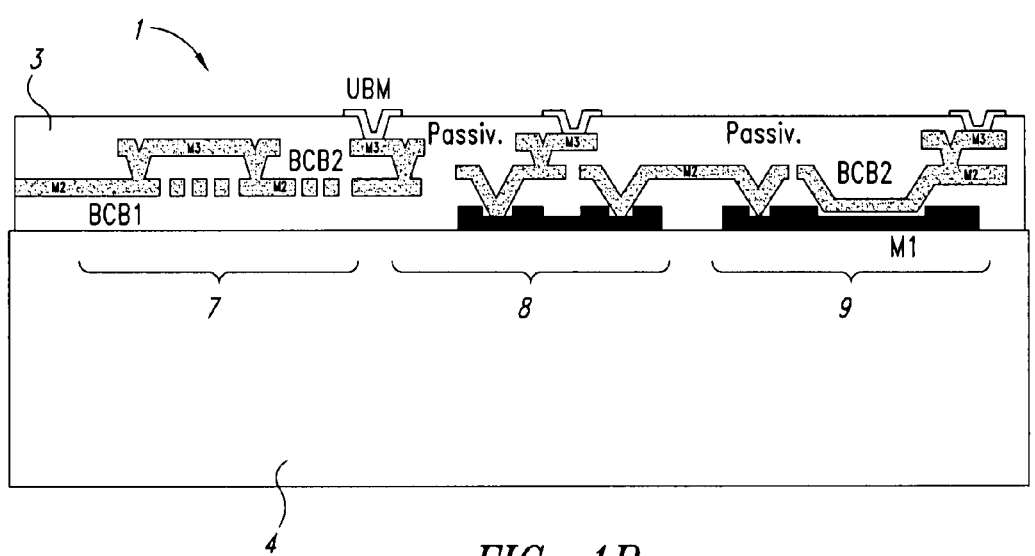

FIG. 1B shows in greater detail a possible realisation of passive components, such as an inductor 7, a resistor 8 and a capacitor 9 integrated in the thin layer 3 and realised by means of suitable metal lines indicated as M1, M2, M3.

In substance, the device 1 comprises passive components 2 and active components, in particular the integrated circuit 5, integrated in an independent way.

The passage from the discrete solution, i.e., with active and passive discrete devices assembled in a package, to devices realised with IPD technology has several benefits, such as a reduction in the number of components used (from 30 to 1), a reduction of the space occupation (from a factor 5 to 1), enhanced electric performances of the devices as a whole, besides lower costs and a higher productivity.

It is to be underlined that the IPD technology allows to integrate passive components on inert substrates, in particular flexible and insulating substrates, able to realise an efficient protection against the electrostatic discharges (ESD). The material being most commonly used in this technology is glass, a substrate realised in glass being able to entrap possible external charges, thus realising an integrated device protected against the electrostatic discharges ESD.

However, the IPD technology lacks active devices.

Figure 2:
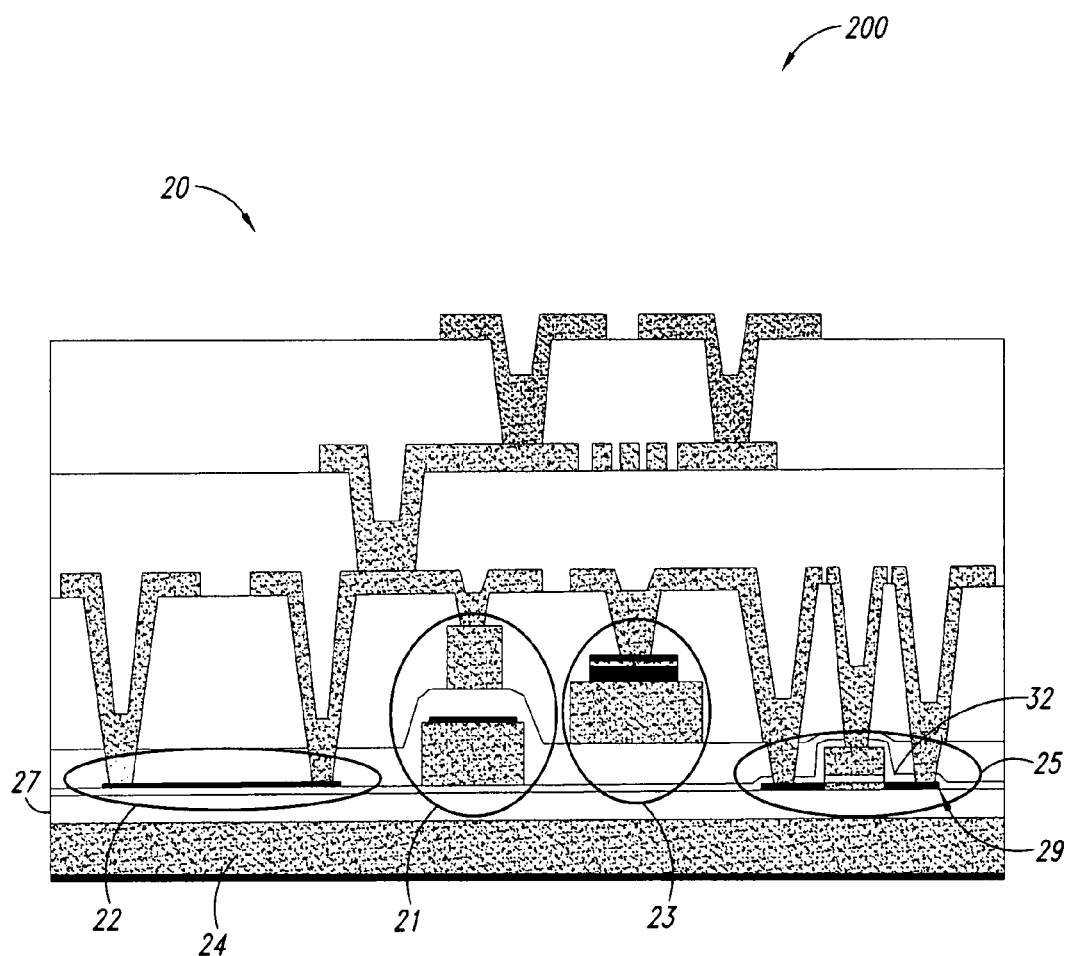
FIG. 2 schematically shows an embodiment of a device comprising passive components and at least one active component in IPD technology with the process according to an embodiment.

With reference to these figures, and in particular to FIG. 2, 20 globally and schematically indicates embodiments of an integrated device with passive and active components in a system 200, such as, for example, a radio frequency system.

It is to be noted that the process steps of embodiments described hereafter are not intended to form a complete process flow for the manufacturing of integrated circuits. Embodiments can be put into practice together with other manufacturing techniques of integrated circuits, such as those currently used in the field. Some commonly used process steps are discussed herein to assist in the comprehension of the present disclosure.

Moreover, the figures showing schematic views of portions of an integrated device during the manufacturing are not drawn to scale, but they are instead shown so as to highlight selected characteristics of embodiments.

Referring to FIG. 2 through 14, the integrated device 20 comprises passive components, in particular, by mere way of illustration, a first capacitor 21, a resistor 22 and a second capacitor 23, integrated on a same substrate 24, in particular an insulating and flexible substrate, realised for example in glass, for electro-optical applications.

The device 20 also comprises an active component 25, for example, a thin film transistor or TFT, integrated on this substrate 24.

In particular, an embodiment of the proposed device arises from the consideration that the technology of thin film transistors or TFT (acronym of the English "Thin Film Transistors") realised in Polysilicon (Poly-Si) in low temperature applications or LTPS (acronym of the English: "Low Temperature Poly Silicon") allows to realise structures of semiconductor components of the TFT type, with n and p channel, with treatment processes at temperatures generally not higher than 550° C., in this way compatible with glass substrates.

In particular, as it will be explained in detail hereafter in the description, by using such a TFT technology, it is possible in an embodiment to realise a TFT transistor with a structure of the self-aligned or SA (acronym of the English: "Self Aligned") or non self-aligned or NSA (acronym of the English: "Not Self Aligned") type integrated on a substrate by using dopants through implantation or deposition and processes of amorphous polysilicon crystallisation, in particular laser processes.

The device 20 according to an embodiment comprises a polysilicon island 29 realised above a protection dielectric layer 27 for the integration of an active component, for example the TFT transistor 25, as well as a pre-implantation dielectric layer 32 wherein the passive components, for example the resistor 22, as well as the first 21 and the second capacitor 23 are realised.

The polysilicon island 29 may be obtained through crystallisation of an amorphous silicon layer 28 (see FIG. 4), as described below, and comprise active regions, source S and drain D regions of the TFT transistor 25, that may be obtained by means of dopant implantations. Moreover, the TFT transistor 25 comprises a gate region G, realised above this island 29 in a region devoid of these source S and drain D regions.

A pre-implantation dielectric layer 32 covers the TFT transistor 25, suitable openings being therethrough provided for the contact with the source S, drain D and gate G regions and thus realises also a covering dielectric layer for this active component.

The pre-implantation and covering dielectric layer 32 may be realised in undoped silica glass (USG).

The present disclosure describes an embodiment of a process for integrating, on an inert substrate 24, a device 20 having at least one passive component 21, 22, 23 and one active component 25 comprising the steps of:
- deposition of a protection dielectric layer on the inert substrate 24;
- formation of a polysilicon island on the protection dielectric layer;
- integration of the active component 25 on the polysilicon island;
- deposition of a covering dielectric layer on the protection dielectric layer and on the active component 25;
- integration of the passive component 21, 22, 23 on the covering dielectric layer;
- formation of first contact structures in openings realised in the covering dielectric layer in correspondence with active regions of the active component 25; and
- formation of second contact structures in correspondence with the passive component 21, 22, 23.

The different steps of the process according to an embodiment will be described in greater detail with reference, by way of illustration, to FIGS. 3 to 14.

Figure 3:
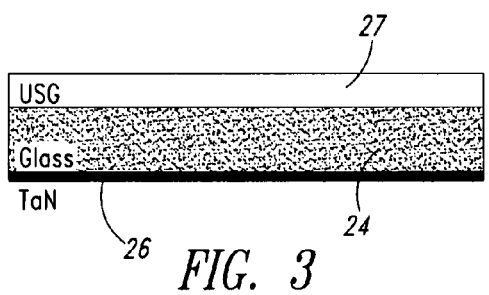
FIGS. 3 to 14 schematically show the device of FIG. 2 in different steps of the integration process according to an embodiment.

With reference to FIG. 3, the integration process according to an embodiment comprises:
- a step of realising the inert substrate 24, in particular of glass;
- a step of cleaning the inert substrate 24 to remove possible pollutants or undesired particles (this step being optional); and
- a step of deposition of an opacification layer 26, for example a thallium nitride layer TaN.

The opacification layer 26 has the aim of opacifying this inert substrate 24 in the back position or "back side" and in the example considered it has a thickness of about 2000 A.

The process according to an embodiment comprises a step of deposition of a protection dielectric layer 27, this step being carried out at a temperature lower than the melting one of the inert substrate 24 (in case of a glass substrate, equal to about 400° C.).

For example, in the embodiment illustrated in FIG. 3, this protection dielectric layer 27 is an undoped silicate glass or USG (acronym of the English: "undoped silicate glass") layer and acts as mechanical, electrical and thermal insulation with respect to the inert substrate 24. The thickness of this protection dielectric layer 27 avoids starting phenomena of parasite, active or passive, devices comprised in the device 20. For example, the protection dielectric layer 27 has thickness equal to some hundreds of nanometres (specifically 5000 A).

Figure 4:
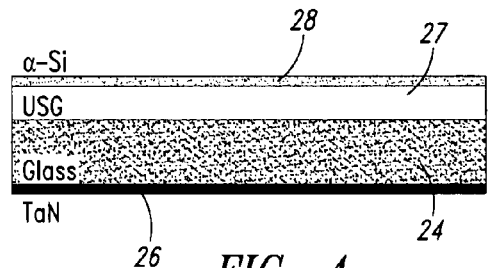

At this point, with reference to FIG. 4, the process comprises a step of deposition of an amorphous silicon layer 28. Also this deposition step may be realised at a lower temperature than the melting one of the inert substrate 24, for example through a PECVD process (acronym of the English: "Plasma-Enhanced Chemical Vapor Deposition") with temperature next to or lower than 300° C., in the case of a glass substrate.

The thickness of the amorphous silicon layer 28 may be in the order of some tens of nanometres, typical values may be around 100 nm.

Then, the process provides a step of crystallisation of the amorphous silicon layer 28, for example realised through radiance by a laser with excimers XeCl and PLC (acronym of the English: "Pulsed Laser Crystallization") technique.

Further to this radiance, the amorphous silicon layer 28 is partially converted into a polysilicon film through an ultra quick melting step and successive resolidification and formation of grains.

The density of the radiance may be chosen so as to induce, in the amorphous silicon layer 28, a SLG (acronym of the English: "Super Lateral Growth") steady crystallisation.

Figure 5:
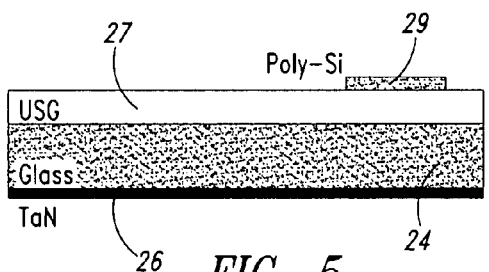
Figure 6:
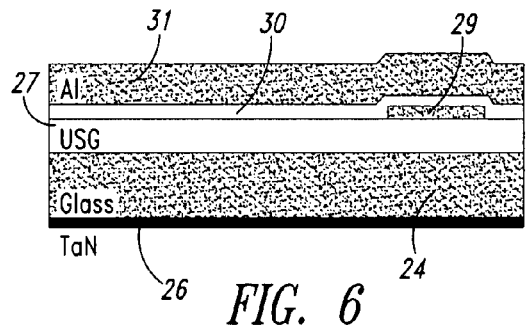

Subsequently, with reference to FIG. 5, the process according to an embodiment comprises a first photolithographic definition and etching step for defining a polysilicon island 29.

In correspondence with this polysilicon island 29, an active component 25, for example a TFT transistor with channel n or with channel p, is integrated.

The process according to an embodiment then comprises:
- a step of deposition of a dielectric layer 30 suitable to form a gate dielectric of the TFT transistor 25 and indicated hereafter as gate dielectric layer 30; and
- a step of deposition, on this gate dielectric layer 30, of a first conductive layer 31, for example of Al, suitable to form a metallization layer or gate metal of the TFT transistor 25.

Advantageously according to an embodiment, the step of deposition of the gate dielectric layer 30 comprises a step of deposition of an USG layer at a temperature of 450° C., for a thickness of approximately 1000 A. This gate dielectric layer 30 in USG joins the protection dielectric layer 27, also realised by an USG layer in correspondence with the surface portion of this protection dielectric layer 27 surrounding the polysilicon island 29.

Moreover, the step of deposition of the first conductive layer 31 may be carried out at a temperature such as 300° C. for a thickness in the order of 3000 A.

Figure 7:
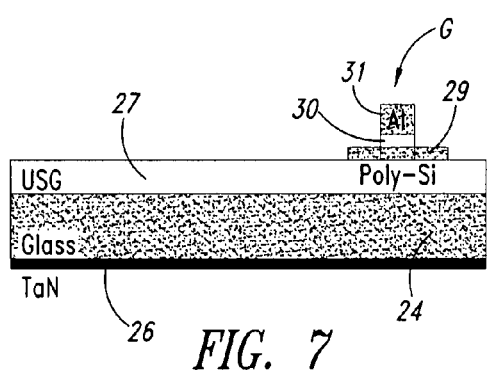

At this point, with reference to FIG. 7, the process comprises a first photolithographic definition and etching step on the first conductive layer 31 and, subsequently, on the gate dielectric layer 30, so as to define a gate region G of the TFT transistor, above the polysilicon island 29.

These etching steps may be carried out in dry for realising a fine control of the final dimensions of the gate region G.

Figure 8:
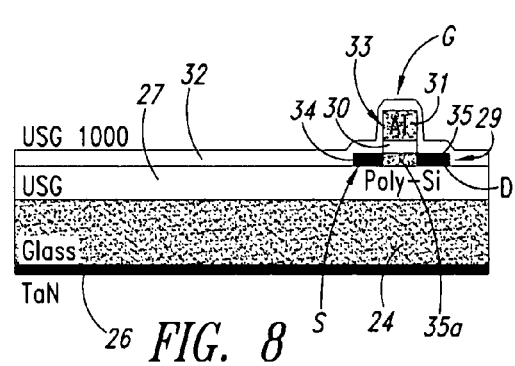

Further, as shown in FIG. 8, the process comprises a step of deposition of a pre-implant dielectric layer 32, having a thin thickness with respect to the protection dielectric layer 27 and to the gate dielectric layer 30, for example in the order of 100 nm.

In a preferred embodiment, also this pre-implant dielectric layer 32 is realised by an USG layer.

It is to be highlighted that the pre-implant dielectric layer 32 forms a spacer region 33 around the gate region G and serves as covering dielectric layer of the TFT transistor 25.

At this point, the process comprises suitable implantation steps for the formation of doped regions 34 and 35 in the polysilicon island 29. In particular, these doped regions 34 and 35 realise respective source S and drain D regions (of the N+ type or of the P+ type) for the TFT transistor 25 (with N channel or with P channel), for example in a self-aligned manner with respect to the gate region G.

These implantation steps also define an active portion 35 of the island 39, below the gate region G and interposed between the source region S and the drain region D, suitable for realising a channel region of the TFT transistor 25.

In an embodiment, these implantation steps may be carried out with dopant doses which are in the order of $10^{14}$-$10^{15}$ atoms/cm$^2$ and energy in the order of some tens of keV (using boron as dopant) or next to 100 keV (using phosphorus).

The process then comprises an annealing step for the activation of the dopants used in the previous implantation steps. The annealing step may be carried out through laser. Suitably, the laser process may only heats a surface region of the wafer, at high temperatures but for short times, the substrate 24, thermally insulated from the protection dielectric layer 27, without reaching high temperatures.

In this way, the annealing step is compatible with a glass substrate, which, as already reminded, has low melting temperatures with respect to the normal temperatures at stake in the integration processes realised in the microelectronics field.

Subsequently, the process comprises the steps of formation of the passive components 21, 22 and 23, realised on the pre-implant dielectric layer 32.

Figure 9:
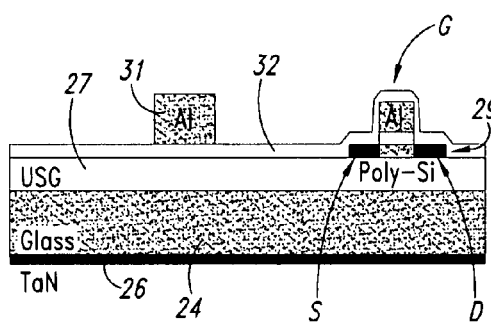

More in detail, as shown in FIG. 9, the process comprises a step of deposition, on the pre-implant dielectric layer 32, of a second conductive layer, in particular of Al, followed by a first patterning step for the formation of a conductive portion 36 suitable for realising a lower plate of a first passive component 21, in particular a first capacitor.

Also in this case, in an embodiment, this step of deposition of the second conductive layer is realised for a thickness of 0.8 micrometers at a temperature lower than the melting one of the inert substrate 24, in particular, at a temperature next to 300° C. Moreover, this patterning step comprises a second photolithographic definition and etching step of the second conductive layer, preferably in dry, for a fine control of the final dimensions of this conductive portions 36.

Figure 10:
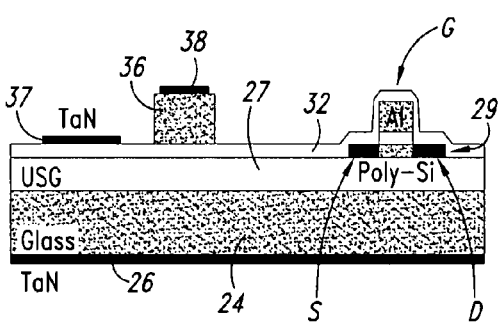

The process comprises, with particular reference to FIG. 10, a step of deposition of a first nitride thin layer, in particular thallium nitride or TaN followed by a second patterning step for realising a first 37 and a second nitride portion 38, in particular on the pre-implant dielectric layer 32 and on the conductive portion 36, respectively.

In an embodiment, this deposition step is realised for a thickness in the order of 600 A and at a temperature next to 200° C., while this second patterning step comprises a third photolithographic definition and etching step in dry.

In particular, the first nitride portion 37 realises the body of the second passive component 22, in particular a resistor, while the second nitride portion 38 realises a separation dielectric in the first capacitor 21.

The process comprises a step of deposition of a separation dielectric layer 39, this separation dielectric layer 39 covering the pre-implant dielectric layer 32, the first nitride portion 37, as well as the conductive portion 36 and the second nitride portion 38. In an embodiment, the deposition step of the separation dielectric layer 39 is realised for a thickness of 5500 A and at a temperature of 450° C. In the case in which this separation dielectric layer 39 is, for example, in USG, it joins the pre-implant dielectric layer 32, for example in USG, except in correspondence with the resistor 22 and the first capacitor 21.

Subsequently, the process comprises a step of deposition, on the separation dielectric layer 39, of a third conductive layer 40, for example of Al. This deposition step may occur, for example, for a thickness of 0.8 micrometers and at a temperature of approximately 300° C.

The process according to an embodiment then comprises deposition, on the third conductive layer 40, of a second nitride thin layer 41, for example, TaN.

In one embodiment, this deposition of a second nitride thin layer may occur, for example at a temperature of approximately 200° C., with a thickness of 1800 A.

Figure 11:
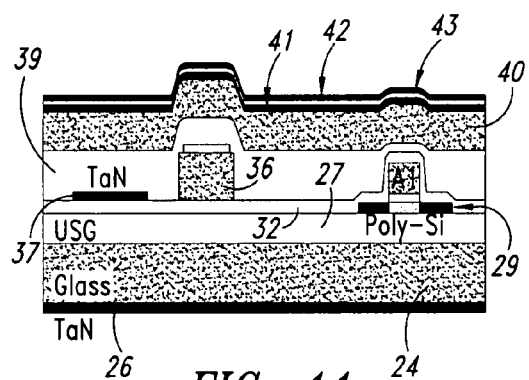

The process goes on with an electrolysis step at 2 nF/mm$^2$-5 nF/mm$^2$ with formation of a layer 42 of, for example, thallium oxynitride TaON or of silicon nitride SiN followed by a plasma step in oxygen $O_2$ and by a step of deposition of a third nitride layer 43, for example TaN, for example at a temperature of approximately 200° C. and for a thickness of 600 A, as shown in FIG. 11.

Figure 12:
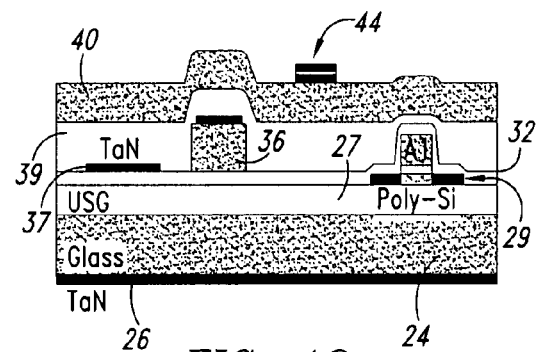

Then, with reference to FIG. 12, the process comprises a fourth photolithographic definition and etching in dry step for the definition of a second island 44, for example of TaN/TaON or SiN/TaN on the third conductive layer 40, this second island 44 forming the third passive component 23, in particular the second capacitor with plates in TaN.

Figure 13:
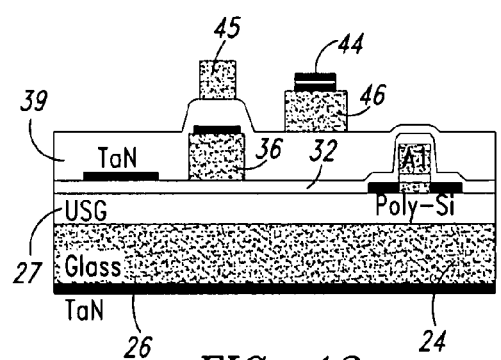

At this point, as shown in FIG. 13, the process provides a third patterning step, in particular a fifth photolithographic and etching in dry step, of the third conductive layer 40 for realising a second 45 and a third conductive portion 46.

In particular, the second conductive portion 45 is realised in correspondence with the first conductive portion 36 and forms with it the first capacitor 21 with Al plates, while the third conductive portion 46 is arranged below the second island 44 to complete the second capacitor 23 with plates in TaN.

Figure 14:
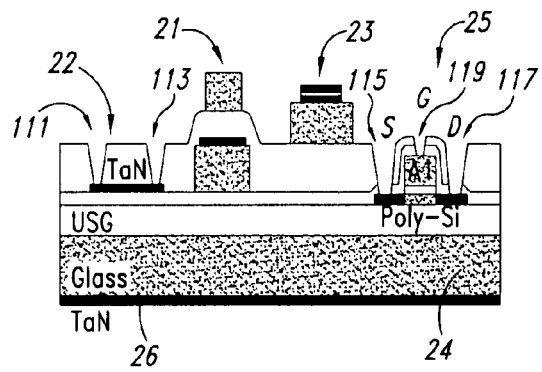

Subsequently, with particular reference to FIG. 14, the process provides a sixth photolithographic definition and etching step for the definition of openings in the separation dielectric layer 39, in particular a first 111 and a second 113 opening in correspondence with the first nitride portion 37 which realises the body of the resistor 21, and a third 115 and a fourth 117 opening in correspondence with the source S and drain D regions of the TFT transistor 25.

Then, the process goes on with a seventh photolithographic definition and etching step, preferably in dry, for defining a fifth opening 119 in correspondence with the first conductive layer 31 which realises the gate metal of the TFT transistor 25.

Finally, the process is completed by a step of realisation of the electric contacts inside the openings of each passive and active component, and by the necessary depositions and successive etchings for the final integration according to the IPD technology, as shown in FIG. 2.

It is to be underlined that the process described uses layers which are characteristic of the IPD technology also for the TFT transistor 25 and are chosen so as to improve the performances of the active components indeed. In particular, as described in relation to an embodiment of the process, an USG layer is used as a gate dielectric for the TFT transistor 25 which also comprises an oxide layer deriving from a PECVD process, as well as an aluminium Al metal gate, compatible with the IPD technology used for integrating the passive components on an inert substrate 24, in particular glass.

The process is not however tied to such a type of substrate and can be extended to plastic substrates. In this case, the used thermal processes will have to be limited below the damage temperature of the substrate itself.

Moreover, in the particular case of integration on a plastic substrate, intermediate layers may be realised between substrate and active layers of the active component which simultaneously address the problems of adhesion of the dielectric materials on the plastic substrate, to favour the reflectivity (dielectric mirrors) in the laser radiance step and the heat dispersion to protect the substrate itself.

The TFT transistor 25 realised through the above described process is of the self-aligned type (SA). It is also possible to modify the process for the realisation of a non-aligned TFT transistor 25.

Figure 15:
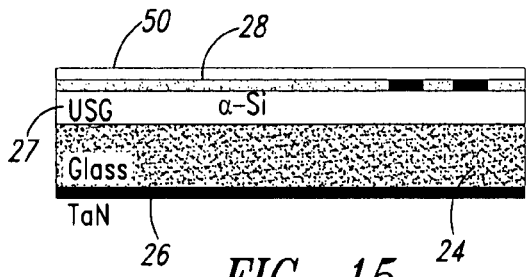
FIGS. 15 to 19 schematically show the device of FIG. 2 in different steps of a first embodiment of the integration process according to an embodiment.

In this case, after the step of deposition of the amorphous silicon layer 28, as above illustrate with reference to FIG. 4, a first alternative embodiment of the process comprises implantation steps for the formation of the doped regions 34 and 35 directly in this amorphous silicon layer 28, as illustrated in FIG. 15.

In particular, these implantation steps are realised with high dopant dose through an implant mask 50.

Figure 16:
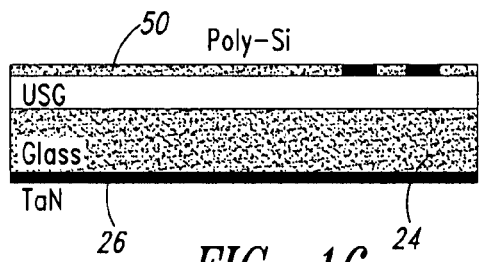

The process then comprises, as before, the crystallisation step of the amorphous silicon layer 28 through laser simultaneously with the activation step of the implanted dopants, as illustrated in FIG. 16, the crystallisation step partially converting the amorphous silicon layer 28 into a polysilicon film 51 through an ultra quick melting step and successive resolidification and formation of grains.

Figure 17:
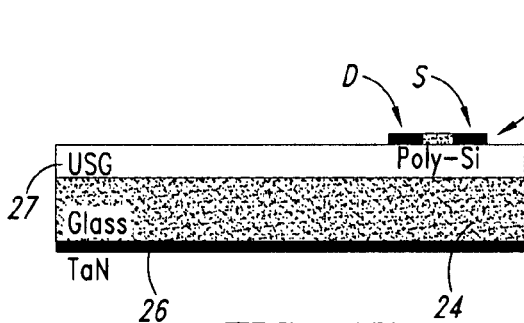

Subsequently, with particular reference to FIG. 17, the process comprises a photolithographic definition and etching step to define the polysilicon island 29, wherein the active component 25 is integrated, for example the TFT transistor.

Figure 18:
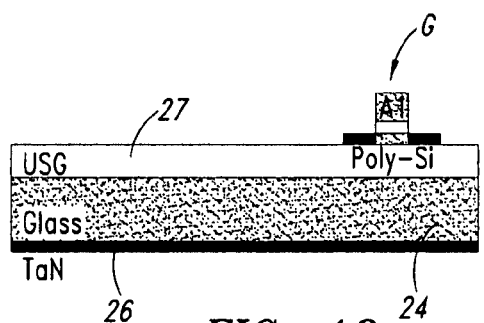
Figure 19:
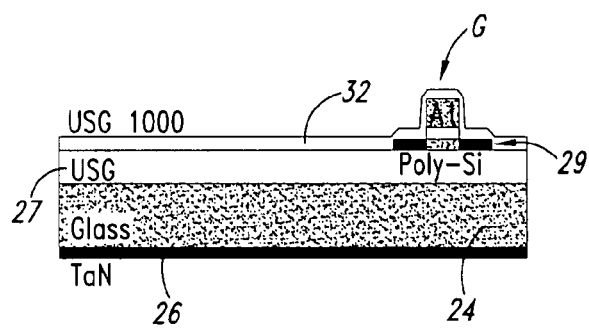

The process according to this alternative embodiment goes on then with the realisation of the gate region G, as illustrated in FIG. 18, and the deposition of the pre-implant dielectric layer 32, as illustrated in FIG. 19, in a similar way as to what has been previously described and so on for all the other steps, thus obtaining the integration of a non self-aligned TFT transistor 25.

It is also possible to realise the source S and drain D regions of the TFT transistor 25 through deposition. In this case, in an embodiment, these source S and drain D regions may be realised through a lift-off process as described in the article by G. Fortunato et al., published on "Solid State Electronics", vol. 46 (2002) 1351-1358.

In particular, by using this lift-off process, the source S and drain D regions are surrounded by dielectric regions (in particular oxide) but not in direct contact with them.

An intermediate region between oxide and source/drain regions is preferably provided for a better selectivity during a successive removal step of the oxide layer. In this way in fact, by subjecting the oxide layer to a removal or selective and prolonged etching it is possible to succeed in substantially removing it below the edge of a resist layer thus creating a discontinuity which makes the lift-off process of the source/drain regions easier.

A second alternative embodiment of the process provides an integration of the TFT and IPD technologies thanks to an overlapping of two layers which are characteristic of the two technologies, in particular, a first conductive layer realised by an aluminium-silicon-copper AlSiCu alloy and used as a metal layer by the integration process of the TFT transistor 25 and a second conductive layer, in particular realised in aluminium Al, characteristic of the IPD technology.

Figure 20:
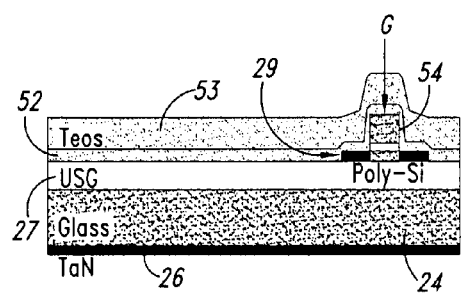
FIGS. 20 to 25 schematically show an embodiment of an integrated device in different steps of a second embodiment of the process according to an embodiment.

According to this alternative embodiment, the process provides that the deposition step (previously illustrated with reference to the deposition of a pre-implant dielectric layer 32 in FIG. 8) realises a TEOS oxide layer as a pre-implant dielectric layer 52, as illustrated in FIG. 20.

In an embodiment, this TEOS pre-implant dielectric layer 52 has a thickness of about 100 nm. In this case, also the gate dielectric of the TFT transistor 25 is of TEOS and the first conductive layer 31 which realises the gate metal of the TFT transistor 25 may comprise an aluminium-silicon-copper (AlSiCu) alloy of thickness of about 300 nm.

According to this second alternative embodiment, the process then comprises, after the deposition step of the pre-implant dielectric layer 52 in TEOS, a deposition step of a further dielectric layer 53, for example TEOS with a thickness of 3000 A, which is added to the pre-implant dielectric layer 52 in TEOS.

The pre-implant dielectric layer 52, the further dielectric layer 53 and the covering dielectric layer 58 form a covering dielectric layer 32a of the transistor device TFT 25 except in correspondence with its source S, drain D and gate G contacts.

Figure 21:
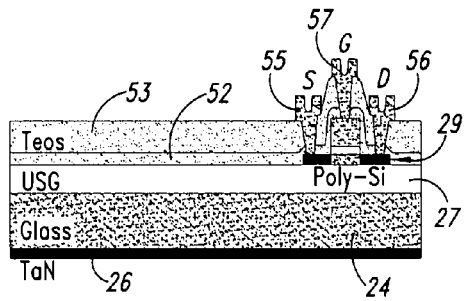

The process then comprises a step of definition of first openings inside this third pre-implant dielectric layer 52 and of this further dielectric layer 53 in correspondence with the source S and drain D regions of the TFT transistor 25, as illustrated in FIG. 21.

This step of definition of openings comprises a photolithographic definition and etching step, preferably in dry.

The process comprises an etching step in wet to define a further opening in correspondence with the gate G region of the TFT transistor 25 followed by a sputtering step of aluminium-silicon-copper alloys for realising source, drain, gate electric contacts inside these first openings, respectively indicate with 55, 56 and 57 in FIG. 21.

At this point, the process comprises a step of deposition of a covering dielectric layer 58. For example, a layer is realised by depositing USG at a temperature lower than the melting one of the substrate (for example 400° C. in the case of glass substrate).

Figure 22:
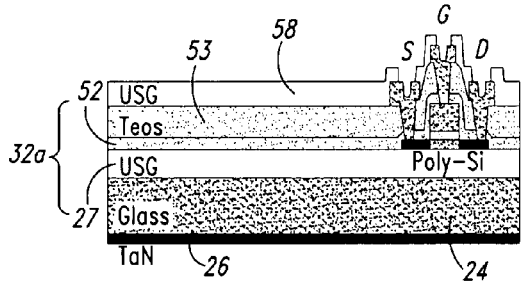

The process then comprises a patterning step for the removal of this covering dielectric layer 58 in correspondence with the electric source S, drain D, and gate G contacts of the TFT transistor 25, as illustrated in FIG. 22.

This patterning step may comprise a photolithographic definition and etching step in wet.

Figure 23:
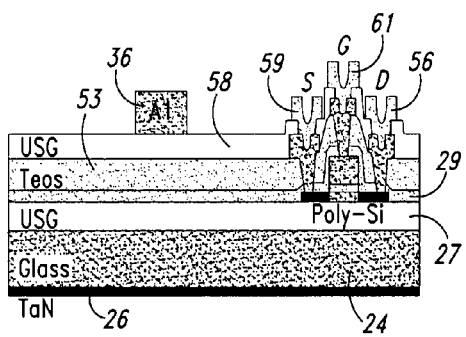

Subsequently, as illustrated in FIG. 23, the process comprises a deposition step of a conductive layer, for example an Al layer, suitably at a temperature lower than the melting one of the inert substrate 24, for example at a temperature next to 300° C. in the case of glass substrate.

For example, this conductive layer is deposited for a thickness of 0.8 micrometers and it joins the covering dielectric layer 58 in USG and the electric contacts of the TFT transistor 25 with the AlSiCu alloy.

The process according to an embodiment goes on with a patterning step of this conductive layer realised for example through a photolithographic masking and etching step, for example in dry, for a fine control of the dimensions, further to which contacts regions 59, 60 and 61 are formed in correspondence with the source S, drain D and gate G electric contacts of the TFT transistor 25, respectively, as well as the conductive portion 36 suitable to realise a lower plate of the first capacitor 21.

The contact with the source S, drain D and gate G regions of the TFT transistor 25 is realised by means of the electric contacts 55, 56 and 57 and the contact regions 59, 60 and 61 in an overlapping of conductive layers which are typical of the TFT technology (in particular the AlSiCu alloy of the electric contacts) and of the IPD technology (in particular the Al layer of the contact regions).

Figure 24:
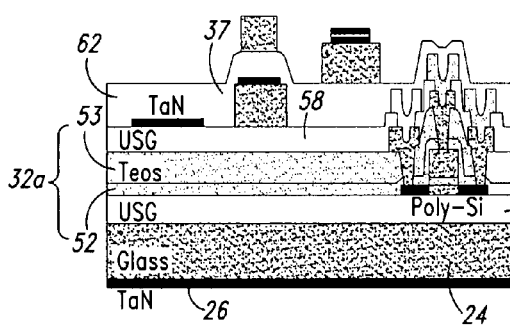
Figure 25:
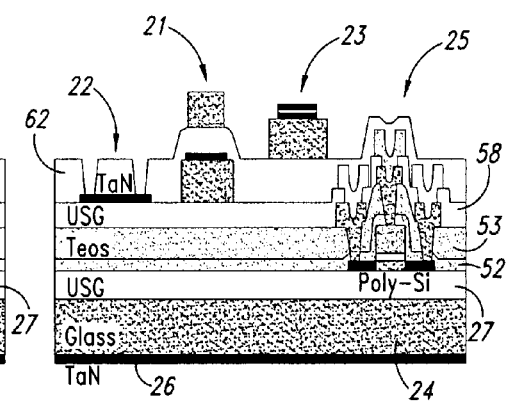

The process is then completed, in a similar way as before, with the steps for the realisation of the resistor 22, of the first capacitor 21 and of the second capacitor 23, as illustrated in FIG. 24.

At this point, the process comprises a step of deposition of a separation dielectric layer 62 as well as a photolithographic definition and etching step, for example in wet, to defined openings inside the separation dielectric layer 62, in particular in correspondence with the first nitride portion 37 which realises the body of the resistor 22.

The process is completed by the steps of realisation of the electric contacts for the resistor 22, the first 21 and the second capacitor 23, as well as the TFT transistor 25, as previously described.

Figure 26:
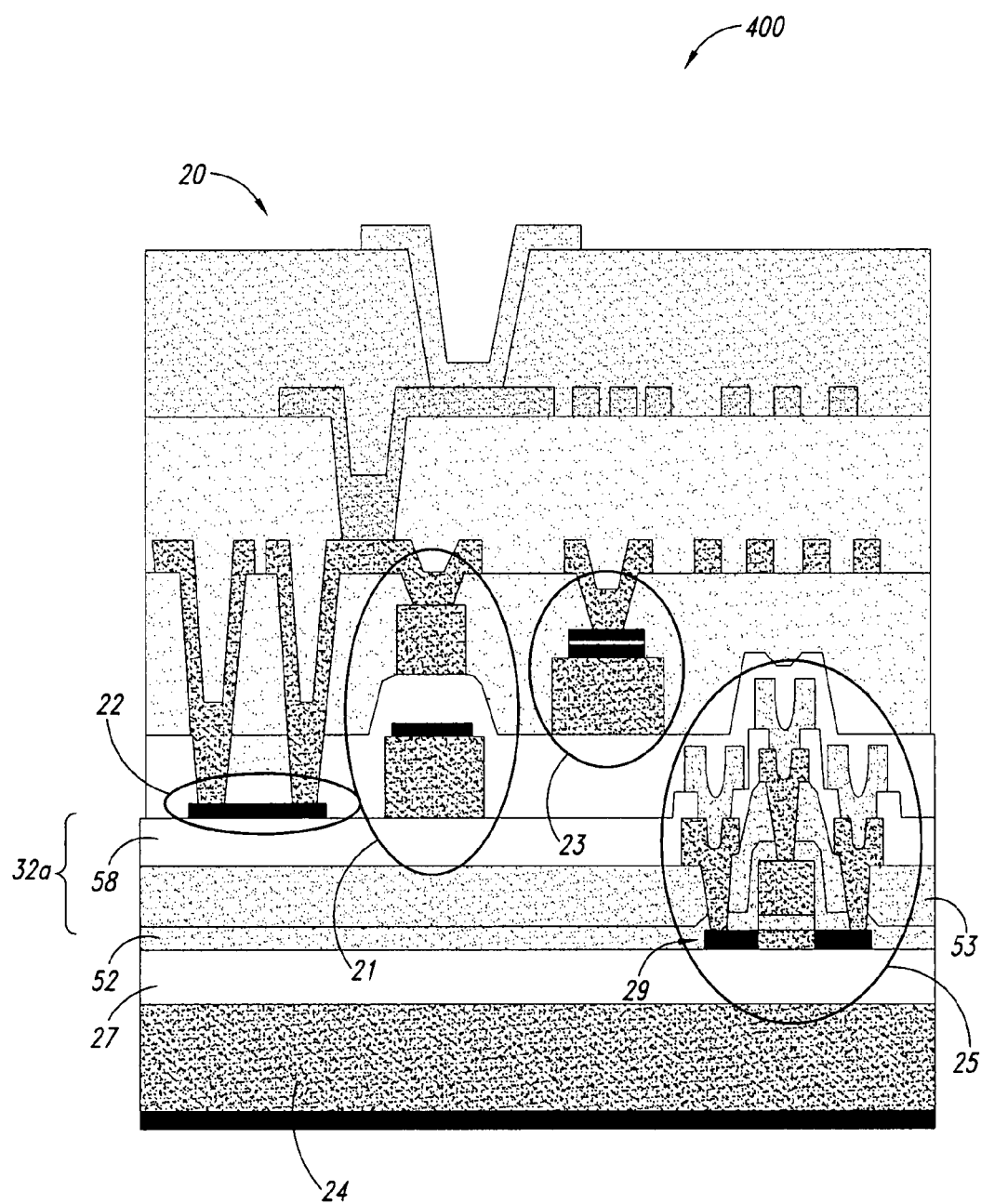
FIG. 26 schematically shows an embodiment of a device obtained according to the second embodiment of the process.

In this way an integrated device 20 is obtained comprising passive components, in particular the first capacitor 21, the resistor 22 and the second capacitor 23, integrated on a same substrate 24 together with an active component, in particular the TFT transistor 25, as illustrated in the system 400 of FIG. 26.

Also in this case, the integrated device 20 comprises a polysilicon island 29 realised above a protection dielectric layer 27 for the integration of the TFT transistor 25.

Moreover, the integrated device 20 obtained with the alternative embodiment of the process comprises the overlapping of the pre-implant dielectric layer 52, of a further dielectric layer 53 and of a covering dielectric layer 58 whereon the passive components are realised, in particular the resistor 22, as well as the first 21 and the second capacitor 23.

The pre-implant dielectric layer 52 and the further dielectric layer 53 are realised in TEOS.

Finally, advantageously according to this alternative embodiment of the process, the portions of contact with the source S, drain D and gate G regions of the TFT transistor 25 comprise electric contacts 55, 56 and 57 and contact regions 59, 60 and 61 in different conductive materials, in particular in AlSiCu and Al alloy, respectively.

The integration process allows to obtain an integrated device 20 comprising an active component, in particular realised on a polysilicon island in TFT technology, integrated together with passive components realised in IPD technology.

This integrated device 20 thus overcomes the limits of the devices realised in IPD technology and shows several application possibilities, in particular in the field of the mobile telephony and of the portable electronics, as well as in the computer field, in particular for the realisation of mother boards.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated device comprising:
an inert substrate;
a protective dielectric layer on the inert substrate;
an active component having a polysilicon island above the protection dielectric layer;
a first covering dielectric layer in contact direct with the protection dielectric layer and covering the active component;
a passive component integrated directly on the first covering dielectric layer;
a second covering dielectric layer in contact direct with the first covering dielectric layer and covering the passive component;
a plurality of electric contacts of a first conductive material in contact with corresponding active region, of the active component; and
a plurality of contact regions in contact with respective electric contacts in the plurality of electric contacts and of a second conductive material different from the first conductive material.

2. Integrated device according to claim 1 wherein said active component is a thin film transistor (TFT).

3. Integrated device according to claim 2 wherein said polysilicon island comprises doped regions corresponding to active source and drain regions of said TFT transistor, which also comprises a gate region, above said polysilicon island in a region devoid of said source and drain regions.

4. Integrated device according to claim 2 wherein the second conductive material is metallic.

5. Integrated device according to claim 1 wherein said first covering dielectric layer comprises an undoped silicate glass (USG) layer.

6. Integrated device according to claim 1 wherein said protection dielectric layer comprises an undoped silicate glass (USG) layer and acts as mechanical, electrical and thermal insulation with respect to said inert substrate.

7. Integrated device according to claim 1 wherein the first conductive material comprises a metallic alloy.

8. Integrated device according to claim 7 wherein the second conductive material comprises an aluminium-silicon-copper alloy.

9. Integrated device according to claim 1 wherein the second conductive material is aluminium.

10. The integrated device of claim 1 wherein the inert substrate comprises a plastic.

11. The integrated device of claim 1, further comprising an opaque layer configured to back the inert substrate.

12. The integrated device of claim 1, further comprising:
a second passive device integrated directly on the second covering dielectric layer.

13. An integrated device comprising:
an inert substrate;
a protective dielectric layer on the inert substrate;
an active component having a polysilicon island above the protection dielectric layer;
a first covering dielectric layer in contact direct with the protection dielectric layer and covering the active component;
a resistor integrated directly on the first covering dielectric layer;
a second covering dielectric layer in contact with the first covering dielectric layer and covering the resistor;
a plurality of electric contacts of a first conductive material in contact direct with corresponding active region of the active component; and
a plurality of contact regions in contact with respective electric contacts in the plurality of electric contacts and of a second conductive material different from the first conductive material.

14. The integrated device of claim 13 wherein said active component is a thin film transistor (TFT).

15. The integrated device of claim 14 wherein said polysilicon island comprises doped regions corresponding to active source and drain regions of said TFT transistor, which also comprises a gate region, above said polysilicon island in a region devoid of said source and drain regions.

16. The integrated device of claim 14 wherein the second conductive material is metallic.

17. The integrated device of claim 13 wherein said first covering dielectric layer comprises an undoped silicate glass (USG) layer.

18. The integrated device of claim 13 wherein said protection dielectric layer comprises an undoped silicate glass (USG) layer and acts as mechanical, electrical and thermal insulation with respect to said inert substrate.

19. The integrated device of claim 13 wherein the first conductive material comprises a metallic alloy.

20. The integrated device of claim 19 wherein the second conductive material comprises an aluminium-silicon-copper alloy.

21. The integrated device of claim 13 wherein the second conductive material is aluminium.

22. The integrated device of claim 13 wherein the inert substrate comprises a plastic.

23. The integrated device of claim 13, further comprising an opaque layer configured to back the inert substrate.

24. The integrated device of claim 13, further comprising:
a passive component integrated directly on the second covering dielectric layer.

25. The integrated device of claim 24 wherein the passive component integrated directly on the second covering dielectric layer is an electrode of a capacitor.

26. An integrated device comprising:
an inert substrate;
a protective dielectric layer on the inert substrate;
an active component having a polysilicon island above the protection dielectric layer;
a first covering dielectric layer in contact direct with the protection dielectric layer and covering the active component;
a portion of a capacitor integrated directly on the first covering dielectric layer;
a second covering dielectric layer in contact direct with the first covering dielectric layer and covering the portion of the capacitor;
a plurality of electric contacts of a first conductive material in contact with corresponding active region of the active component; and
a plurality of contact regions in contact with respective electric contacts in the plurality of electric contacts and of a second conductive material different from the first conductive material.

27. The integrated device of claim 26 wherein said active component is a thin film transistor (TFT).

28. The integrated device of claim 27 wherein said polysilicon island comprises doped regions corresponding to active source and drain regions of said TFT transistor, which also comprises a gate region, above said polysilicon island in a region devoid of said source and drain regions.

29. The integrated device of claim 27 wherein the second conductive material is metallic.

30. The integrated device of claim 26 wherein said first covering dielectric layer comprises an undoped silicate glass (USG) layer.

31. The integrated device of claim 26 wherein said protection dielectric layer comprises an undoped silicate glass (USG) layer and acts as mechanical, electrical and thermal insulation with respect to said inert substrate.

32. The integrated device of claim 26 wherein the first conductive material comprises a metallic alloy.

33. The integrated device of claim 32 wherein the second conductive material comprises an aluminium-silicon-copper alloy.

34. The integrated device of claim 26 wherein the second conductive material is aluminium.

35. The integrated device of claim 26 wherein the inert substrate comprises a plastic.

36. The integrated device of claim 26, further comprising an opaque layer configured to back the inert substrate.

37. The integrated device of claim 26, further comprising:
a passive component integrated directly on the second covering dielectric layer.

38. The integrated device of claim 37 wherein the passive component integrated directly on the second covering dielectric layer is a second portion of the capacitor.

* * * * *